United States Patent
Greene et al.

(10) Patent No.: US 7,538,339 B2
(45) Date of Patent: May 26, 2009

(54) SCALABLE STRAINED FET DEVICE AND METHOD OF FABRICATING THE SAME

(75) Inventors: Brian J. Greene, Yorktown Heights, NY (US); Sameer H. Jain, Beacon, NY (US); William K. Henson, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 11/615,153

(22) Filed: Dec. 22, 2006

(65) Prior Publication Data

US 2008/0150033 A1  Jun. 26, 2008

(51) Int. Cl.
*H01L 29/94* (2006.01)
(52) U.S. Cl. .................. 257/18; 257/E29.295
(58) Field of Classification Search ............ 257/18, 257/19, 190, 192, E29.295, E29.297, E29.298, 257/E29.299
See application file for complete search history.

(56) References Cited

U.S. PATENT DOCUMENTS 7,002,209 B2  2/2006  Chen et al.

2005/0247926 A1*  11/2005  Sun et al. ................. 257/19
2006/0199326 A1*  9/2006  Zhu et al. ................. 438/201
2007/0099360 A1*  5/2007  Lee et al. .................. 438/197

OTHER PUBLICATIONS

Paul Grudowski et al., "1-D and 2-D Geometry Effects in Uniaxially-Strained Dual Etch Stop Layer Stressor Integrations", 2006 Symposium on VLSI Technology Digest of Technical Papers, 2006, 2 pages.
S. Pidin et al., "MOSFET Current Drive Optimization Using Silicon Nitride Capping Layer for 65-nm Technology Node", 2004 Symposium on VLSI Technology Digest of Technical Papers, 2004, 2 pages.

* cited by examiner

*Primary Examiner*—Thomas L Dickey
(74) *Attorney, Agent, or Firm*—H. Daniel Schnurmann

(57) ABSTRACT

An integrated circuit including pairs of strained complementary CMOS field-effect devices consisting of n-FET and p-FET transistors on a substrate. The n-FET is provided with a compressive dielectric stressor, while the p-FET is provided with a tensile stressed dielectric. Each dielectric stressor includes a discrete horizontal segment on a surface overlying and contacting the gate of the respective FET. The stress enhancement is insensitive to PC pitch, and by reducing the height of the polysilicon stack, the scalability which is achieved contributes to a performance improvement. The n-FET leverages higher stress values that are obtainable in the compressive liners are greater than 3 GPa compared to less than 1.5 GPa for tensile liners.

5 Claims, 7 Drawing Sheets

CMP to remove nitride on top of the polysilicon (i.e., to have the surface above the target FET planarized)

SCALABLE STRAINED FET DEVICE AND METHOD OF FABRICATING THE SAME

FIELD OF THE INVENTION

The invention is related to semiconductor devices, and more particularly, to field effect transistors (FETs) showing an improved performance by incorporating scalable stressed channels.

BACKGROUND OF THE INVENTION

The ability to scale CMOS devices to smaller dimensions has allowed integrated circuits to experience continuous performance enhancements. Moreover, in spite of economic considerations, constraints on device designs and materials are hampering further improvements in scaling the devices. Since constraints in scaling are imposing fast approaching limits beyond which technical and economic constraints make additional scaling unappealing, new techniques have been developed to continuously increase the device performance.

One alternative which has gained popularity is to impose certain mechanical stresses within a semiconductor device substrate which can be advantageously used to modulate the device performance. For example, in silicon, hole mobility is enhanced when the silicon film is under compressive stress, while the electron mobility is enhanced when the silicon film is under tensile stress. Therefore, compressive and/or tensile stresses can be advantageously created in the channel regions of a p-FET and/or an n-FET in order to enhance the performance of such devices. However, the same stress component whether compressive or tensile, discriminatively affects the performance of the p-FET and the n-FET devices. Alternatively, compressive stress in the silicon, while it enhances the performance of the p-FET, it adversely affects the performance of the n-FET, while a tensile stress enhances the performance of the n-FET while adversely impacting the performance of the p-FET. Therefore, p-FET and n-FET require different types of stresses for performance enhancement, which imposes a challenge when concurrently fabricating high performance p-FET and n-FET devices, due to the difficulty in simultaneously applying compressive stress to the p-FET and tensile stress to the n-FET.

One approach for creating desired compressive and tensile stresses in the channel regions of p-FET and n-FET devices is to overlay the p-FET and the n-FET devices with separate compressive and tensile stressed dielectric films so that the tensile and compressive stresses can be respectively applied to the n-FET and p-FET devices.

Another problem of significance is the trend towards devices having smaller and smaller dimensions. Researchers have investigated the impact of technology scaling in reducing the effectiveness of virtually all known stress enhancement techniques. Channel stress from stressed liners is reduced with a tighter PC pitch, shorter polysilicon stacks and embedded SiGe (and embedded carbon), wherein the effectiveness is reduced with smaller RX-past-PC dimensions, for example. Hence, when migrating from one technology node to the next, one must find ways to overcome the degradation associated with scaling and find additional options to improve the technology performance further. Traditionally, this has been achieved by brute force, i.e., by way of higher stress liners, higher germanium content in eSiGe, and the like, or by significantly modifying the device materials/structure, such as embedded SiC.

Present day stress devices are currently manufactured with a stress inducing liner that is advantageously formed atop the gate region, the exposed surface of the substrate adjacent to the gate region and silicide contacts. An example of such stress devices is found, e.g., in U.S. Pat. No. 7,002,209 to Xiangdon Chen et al., of common assignee. The patent describes methods of forming a liner such that it contacts the sidewalls of the gate conductor. When thin sidewall spacers are used, the stress inducing liner is positioned on the thin sidewall spacer such that the thin sidewall spacer separates the stress inducing liner from the gate region. The stress inducing liner is deposited under conditions that create a compressive or a tensile stress. The method described in the aforementioned patent, however, is limited to the use of a single stress liner.

Another problem arising by the ever shrinking ground rules governing high performance technologies is caused by the loss of stress when reducing the pitch of the gate electrode conductor. This phenomenon has been described in the current literature, and more particularly in the paper "1-D and 2-D effects in uniaxially-strained dual etch stop layer stressor integrations" by Paul Grudowski et al., published in the Digest of Technical Papers of the 2006 Symposium on VLSI Technology. Therein are described a detailed electrical and simulation characterization of 2-D boundary effects and 1-D poly pitch response of highly stressed dual etch stop layer integrations, and how these effects impact achievable transistor performance gains and improved circuit designs. A contact etch stop layer used as a stressor has demonstrated significant performance improvements, particularly when employed in a dual integration. Still, the problem caused by continuously scaling down the devices remains.

A further problem imposed by traditional scaling methods is caused by the loss of stress when reducing the height of the gate electrode conductor. This phenomenon has also been described in the current literature, and more particularly in a paper "MOSFET Current Drive Optimization Using Silicon Nitride Capping Layer for 65-nm Technology Node" by S. Pidin et al., published in the Digest of Technical Papers of the 2004 Symposium on VLSI Technology. Therein is described a simulation characterization of device channel stress response to gate electrode height for highly stressed etch stop layers. Thus, a tradeoff is established between the traditional scaling benefits of gate height reduction, namely parasitic capacitance reduction due to a reduced gate sidewall area, and the stress imparted to the channel from a stressed liner.

In order to better appreciate the advantages, aspects and benefits of the present invention, prior art stressed complementary FET devices will now be described in order to distinguish the device structure of the present invention when it is compared to conventional prior art devices.

Referring to FIG. 1a, there is shown a pair of complementary FET devices (i.e., n-FET and p-FET) illustrating a first stress liner atop the transistor already patterned to induce the desired mobility gain. The first stress liner can be either tensile or compressive and thickness ranges from 40 nm-100 nm, with 50 nm being more typical. The stress liner in FIG. 1a is patterned using standard lithography and etching techniques where the stress liner is left on top of the devices that result in a mechanical strain favorable for increasing the mobility of the carriers. Tensile stress liners impart a stress that increases the electron mobility, while compressive stress liners impart a stress that increases the hole mobility. The stress liner is preferably any dielectric commonly used in semiconductor processing (SiN, $SiO_2$, SiCOH, $HfO_2$, SiCN, $ZrO_2$), although SiN is preferably used.

Referring to FIG. 1b, the same pair of complementary FET devices are depicted having a second stress liner already patterned. The second stress liner should provide an opposing stress from that provided by the first stress liner and be removed from transistors that are covered by the first stress liner. For example, if the first stress liner is tensile, then the second stress liner should be compressive. The second stress liner should preferably have a thickness ranging from 40 nm-100 nm, with 50 nm being more typical. The second stress liner can be any of the standard dielectrics used in semiconductor processing (SiN, $SiO_2$, SiCOH, $HfO_2$, $ZrO_2$, SiCN), although SiN is more commonly used.

Still referring to FIG. 1b, a thin oxide layer is deposited after patterning the first liner but before depositing the second liner in order to achieve etch selectivity if the second stress liner is made of a similar material as the first stress liner.

Next, referring to FIG. 2, another dielectric layer is deposited atop the silicon wafer. The dielectric is typically a low temperature $SiO_2$ deposition with thickness ranging from 150 nm-250 nm, with 210 nm being more typical.

Referring to FIG. 3, the same semiconductor structure is illustrated after applying Chemical Mechanical Polish (CMP), resulting in the oxide being removed by this standard polishing step commonly used in semiconductor processing. The oxide is preferably removed until the top of the gate conductor electrodes are exposed, leaving no oxide. The final surface needs to be flat with no surface topography to have the surface directly above the target FET totally planarized.

The devices shown thus far suffer from a distinct degradation when the pitch between the complementary devices shrinks as the technology migrates from one node to the next. During the pitch reduction, the length of the stress nitride-silicon film interface is reduced, which in effect, reduces the stress coupling from the liner to the silicon film and MOSFET channel. In addition, the resulting stresses induced devices shown thus far remain susceptible to degradation from gate height reduction. This is because the stress in the channel is created by edge forces induced at the stressed-liner/sidewall spacer/silicon film intersection, the strength of which depend upon the poly height, as well as stressed-liner thickness, poly pitch, and the like.

Accordingly, there is a need in industry for a process of forming dual stress liners in which enhanced n-FET stress from a compressive cap can be achieved by reducing the polysilicon height without degradation during PC pitch scaling.

OBJECTS AND SUMMARY OF INVENTION

Accordingly, it is an object of the present invention to provide enhanced FET devices displaying an improved performance by incorporating a scalable stressed channel.

It is another object of the invention to improve the performance by providing a dual-stress liner atop the gates of complementary FET devices.

It is a further object to induce the n-FET stress from a compressive cap which does not degrade with PC pitch scaling, and where enhancement from the compressive cap increases with gate height reduction.

It is still a further object to provide a compressive liner having significantly higher stress than corresponding tensile counterparts.

It is yet another object to make the inventive structure compatible with replacement gates while ensuring a low implementation cost.

In accordance of one aspect of the invention, the performance of a CMOS FET device improves significantly by taking advantage of known dual-stress-liner effects, making use of compressive nitride in an appropriate geometric configuration to induce tensile stress in the n-FET channel, and similarly employ a tensile nitride for compression in the p-FET.

Of particular importance to this approach resides in its scalability. The stress enhancement is designed to be insensitive to PC pitch, a distinct advantage, and to increase by reducing the height of the gate stack. In addition, since the n-FET can leverage the higher stress values obtainable by compressive liners (i.e., >3 GPa, compared to <1.5 GPa for tensile), considerable benefits with this approach are anticipated.

The present invention provides a semiconductor device that includes: at least one n-channel field effect transistor (n-FET) and at least one p-channel field effect transistor (p-FET) that are spaced apart from each other on a substrate; and a first dielectric stressor layer overlaying the gate of at least one n-FET and a second dielectric stressor layer overlaying the gate of at least one p-FET, wherein the first dielectric stressor layer is compressively stressed and the second dielectric stressor layer is tensilely stressed.

BRIEF DESCRIPTION OF THE DRAWINGS

For a more complete understanding of the present invention and the advantages thereof, reference is now made to the following description of the invention taken in conjunction with the accompanying figures, in which.

DETAILED DESCRIPTION OF THE INVENTION

In the following description, numerous specific details are set forth, such as particular structures, components, materials, and dimensions, in order to provide a thorough understanding of the present invention. However, it will be readily appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to being "connected" or "coupled" to another element, it is directly connected or coupled to the other element or intervening elements may be present. In contrast, when an element is referred to as being "directly connected" or "directly coupled" to another element, there are no intervening elements present.

Figure 4:
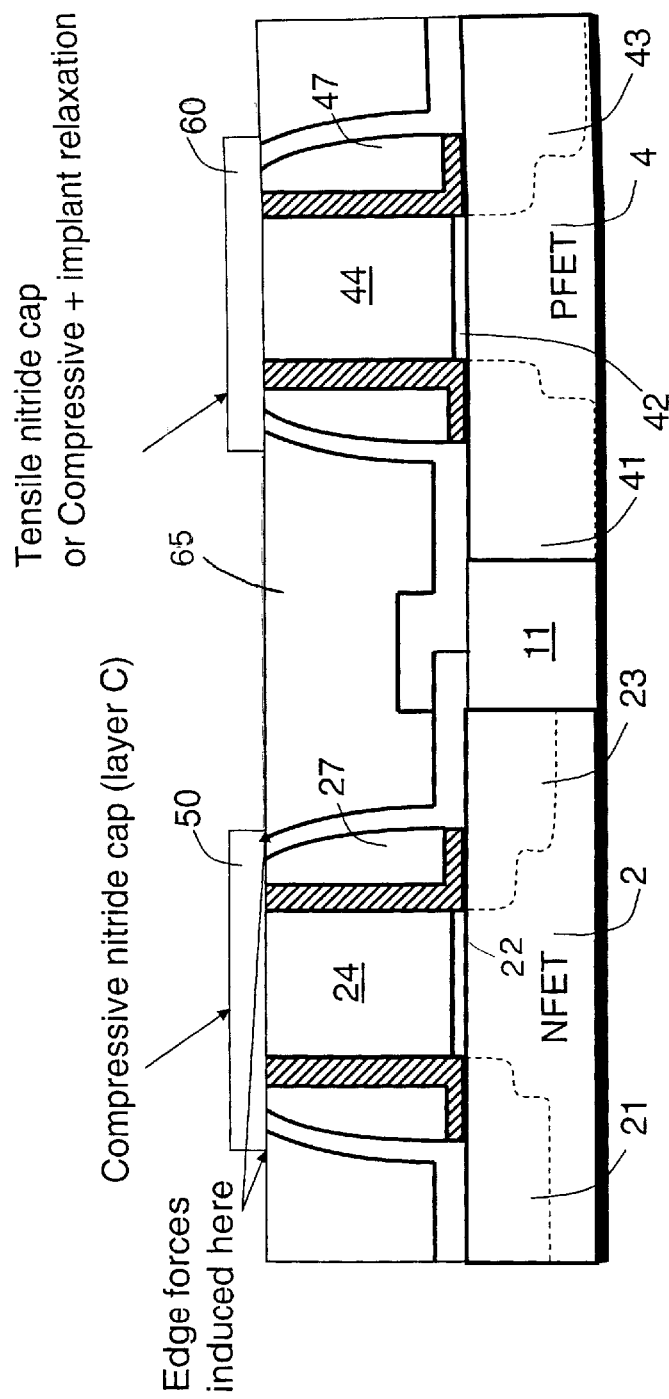
FIG. 4 illustrates improved devices wherein a compressive nitride cap has been deposited on top of the n-FET gate, and a compressive nitride cap or tensile nitride cap or a combination of a compressive layer that includes implant relaxation has been deposited on top of the p-FET gate, in accordance with a preferred embodiment of the present invention, wherein edge forces are induced at the two ends of the cap.

FIG. 4 shows a cross-sectional view of a CMOS device according to one embodiment of the present invention.

The present invention provides an improved CMOS device that includes at least one n-FET and at least one p-FET with a dielectric stressor, preferably a nitride layer, directly connected to the gate of each of the FET devices, hereinafter referred to as a "cap". The dielectric stressor caps provide the desired stresses on the n-FET and the p-FET devices.

More specifically, the CMOS device comprises an n-FET that is located over an n-FET active region 2 and a p-FET that is positioned over a p-FET active region 4. The n-FET active region 2 and p-FET active region 4 are located in the same semiconductor substrate (not shown), separated from each other by isolation region 11. The n-FET active region 2 contains n-type source and drain doping regions (not shown) with source and drain silicide contacts 21 and 23. Similarly, the p-FET active region 4 contains n-type source and drain doping regions (not shown) with source and drain silicide contacts 41 and 43. Both, the p-FET and n-FET are separated from each other by a common dielectric layer 65.

Separate gate structures, one of which is formed by: (1) a first gate conductor 24, (2) a gate metal silicide 25, and (3) and at least one spacer 27, and the other that includes: (1) a second gate conductor 44, (2) a second gate metal silicide 45, and (3) at least one spacer 47, which are formed over n-FET active region 2 and p-FET active region 4, respectively. Gate dielectrics 22 and 42 respectively isolate the n-FET active region 2 and the p-FET active region 4 from the first and second gate conductors 24 and 44.

The respective gates of the n-FET and p-FET are capped by stress layers, preferably by a compressively stressed nitride cap on top of the n-FET, and either by a compressively nitride cap or a tensilely nitride cap or a compressively stressed nitride cap that includes implant relaxation.

The dielectric stressor cap layers 50 and 60 preferably includes any suitable dielectric material whose stress profiles can be modulated or adjusted. Preferably, but not necessarily, the continuous dielectric stressor layer 50 includes SiN.

The above-described stressor layers 50 and 60 is advantageously formed by a selective UV-treatment process, which has been found by the inventors of the present invention to be particularly effective in converting compressive stress of a dielectric film into tensile stress.

Exemplary processing steps that can be used for forming the dielectric stressor cap 50 and 60 in the CMOS device structure illustrated by FIG. 4 will now be described in greater detail. Note that in the drawing, which is not drawn to scale, like and/or corresponding elements are referred to by like reference numerals. It is further noted that in the drawings only one n-FET and one p-FET are shown. Although illustration is made to such an embodiment, the present invention is not limited to the formation of any specific number of n-FETs and/or p-FET devices, and can easily include an array formation of such devices.

Referring to FIG. 4, the semiconductor structure after depositing and patterning a stress liner layer (layer C in the drawing) is shown where the patterned layer is centered over the gate electrode. The edges of stress liner C in FIG. 4 impart a mechanical stress on the channel that can increase the mobility of the carriers.

The stress liner can be any dielectric used in semiconductor processing (SiN, $SiO_2$, SiCOH, $HfO_2$, $ZrO_2$, SiCN), although SiN is preferred. The thickness of the stress liner ranges from 10 nm to 800 nm, but 40 nm is preferred. The stress liner create either compressive or tensile stress; however, compressive stress is preferred since higher magnitudes of stress can be achieved for compressive SiN stress liners compared to tensile stress liners. Typical compressive SiN stress liners preferably have a stress value of 3 GPa or greater, while tensile SiN stress liners have a stress value of 1.5 GPa. The larger compressive stress liner has been found to impart more stress, translating to a higher mobility gain.

The compressively stressed dielectric layer, as mentioned previously, is made, e.g., of SiN, which can be readily formed by plasma-enhanced chemical vapor deposition (PECVD) process or a high-density plasma (HDP) process that is carried out at a temperature ranging from about 300° C. to about 450° C., a pressure ranging from about 0.5 torr to about 6 torr, and a plasma power level ranging from about 100 W to about 1500 W, using processing gases that include trimethylsilane, $NH_3$, and $N_2$.

Still referring to FIG. 4, a compressive stress liner (liner C) results in providing tensile mechanical stress in the transistor channel; therefore, it is best to pattern the stress liner C over the n-FET transistor to produce the desired gains in performance.

Figure 1A:
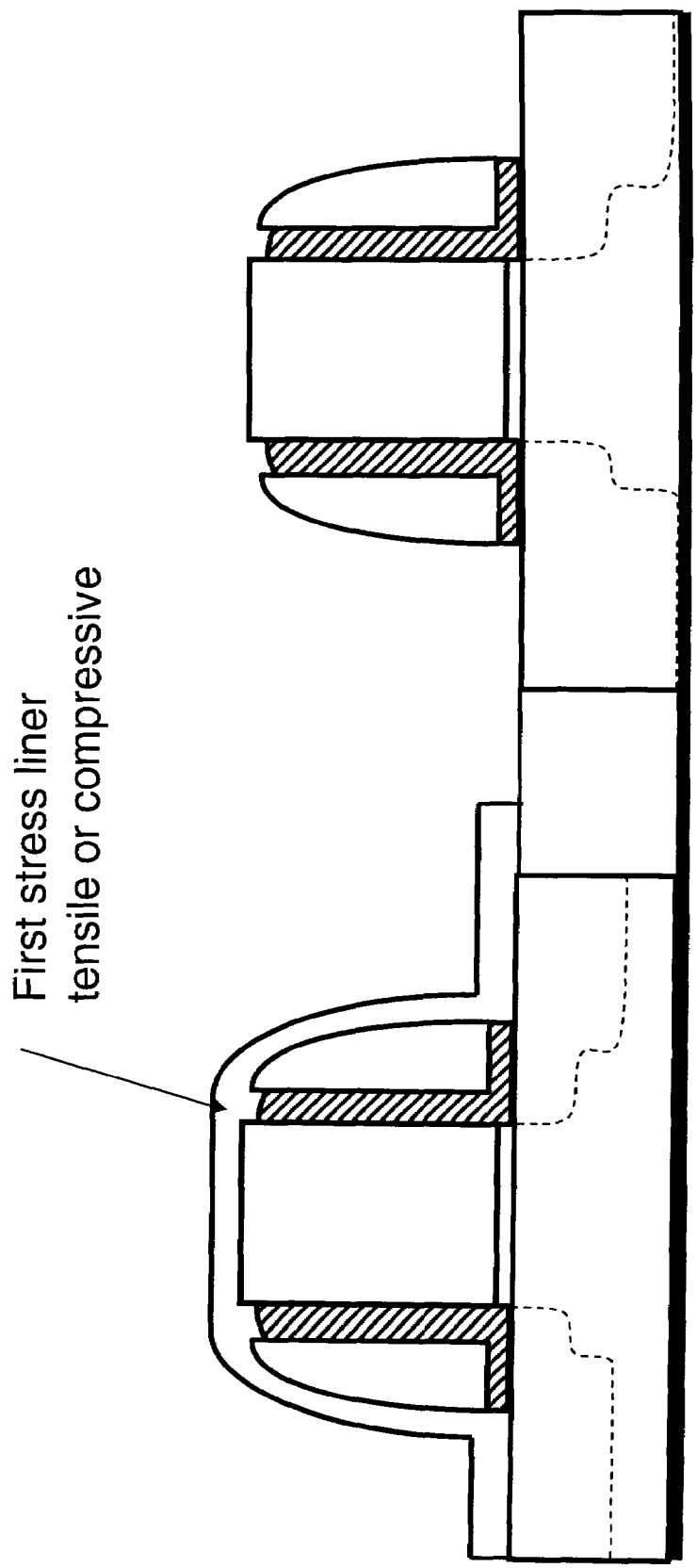
FIG. 1a is a schematic diagram illustrating prior art complementary FET devices on a substrate wherein a first liner has been deposited in selected areas (up to middle-of-line (MOL) dielectric deposition)
Figure 1B:
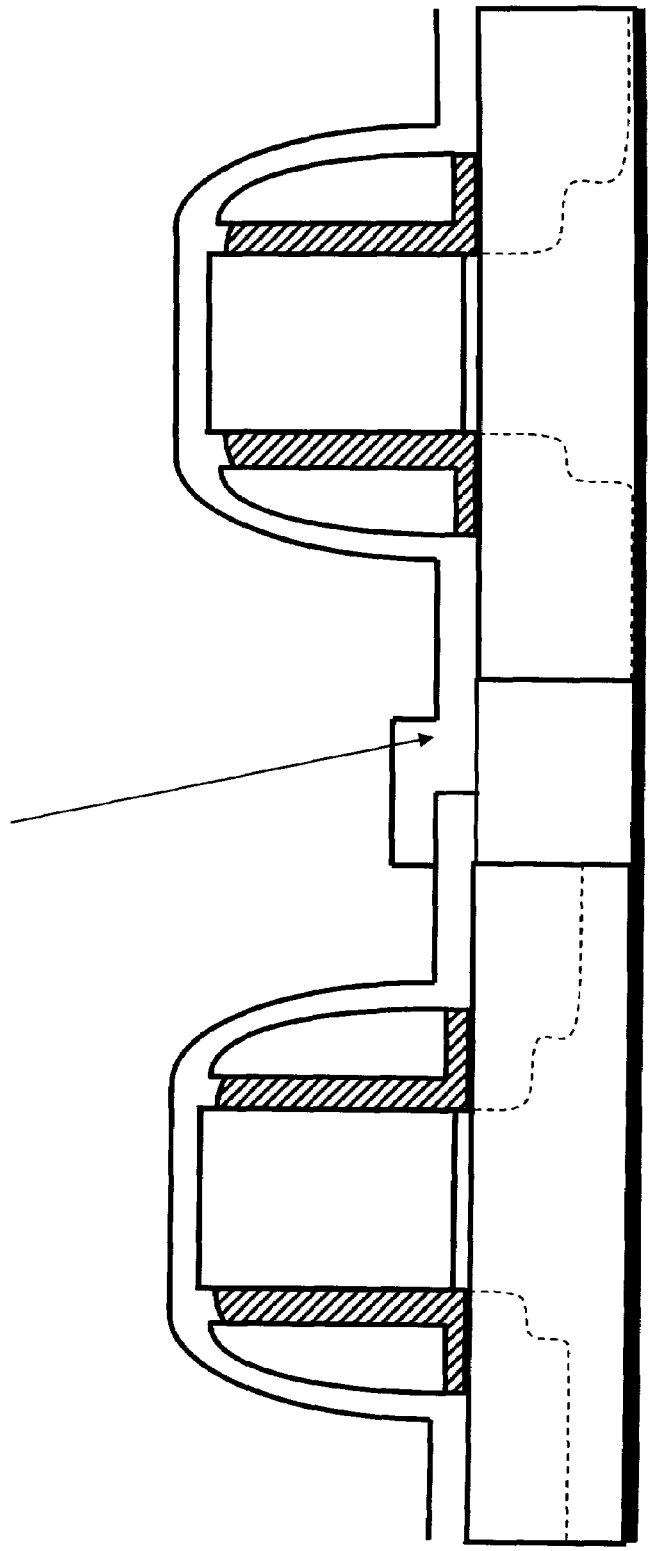
FIG. 1b is a schematic diagram illustrating the prior art complementary pair of FET devices in which a second liner has been deposited in selected areas (up to MOL dielectric deposition)
Figure 2:
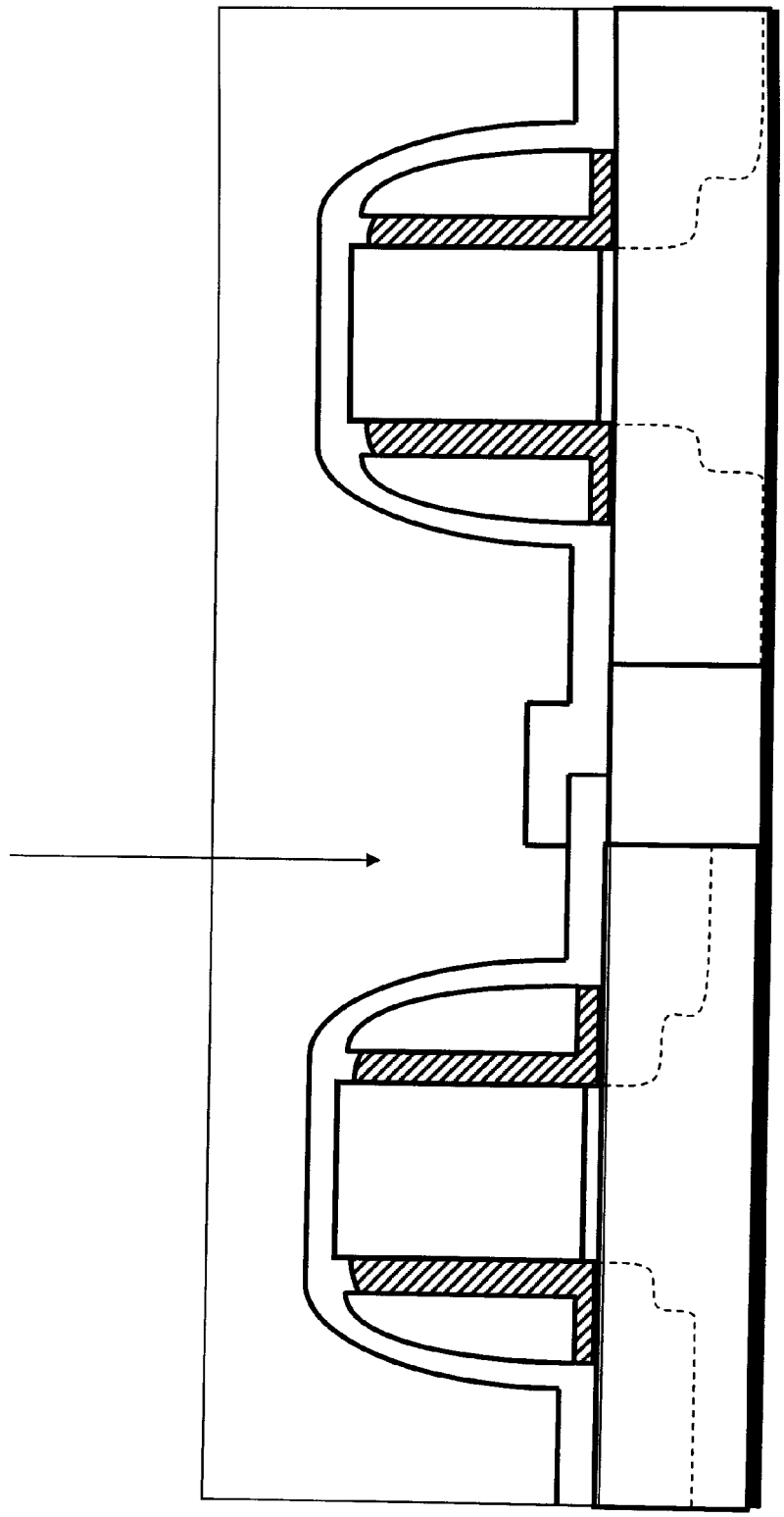
FIG. 2 is schematic diagram illustrating the two prior art complementary FET devices of FIG. 1b wherein a blanket oxide layer has been deposited atop the two devices.

Referring back to previously described FIG. 1b, a tensile stress liner on the n-FET was illustrated and a compressive stress liner on the p-FET. The tensile (compressive) nitride on the source drain regions of the n-FET (p-FET) induces a tensile (compressive) stress in the channel region, which in turn improves the electron (hole) mobility within the channel. The magnitude of the stress induced in the silicon depends on (among other factors) the lateral extent of the nitride away from the silicon channel. During scaling, due to the ground rule shrink, adjacent gates become closer to each other. This results in the lateral extent of the nitride becoming smaller and so the stress induced in the channel also reduces.

Still referring to FIG. 1b, while the nitride film on top of the source and drain regions induced tensile stress in the channel, the tensile nitride on top of the gate, in contrast, induced a compressive stress in the channel reducing the stress caused by the nitride film at the bottom. Further, as the height of the gate is reduced, the top nitride comes closer to the channel and the compressive stress induced by this nitride film increases. Thus, reducing the gate height also reduces the stress induced by the whole tensile nitride film (for a given stress in the nitride film).

Now referring to FIG. 4, the tensile nitride is removed only from the top of the n-FET and is replaced with a compressive nitride layer. The compressive liner is then etched, creating an edge force at each of the compressive liner sidewalls, as indicated in the drawing. The compressive nitride on top of the gate induces a tensile stress in the silicon channel (opposite of what the tensile nitride film on top of the gate earlier induced). This adds to the tensile stress being induced by the tensile nitride over the source-drain regions, increasing the stress in the channel. Bringing the compressive nitride on top of the gate closer to the channel, (i.e., by reducing the gate height) increases the tensile stress induced in the channel. Finally, it is observed that the lateral extent (or the length) of the compressive nitride does not need to scale as the pitch (distance between two adjacent devices) is reduced. The present inventive method circumvents the problem related to the reduction of the improvement when the pitch is scaled downward. Finally, the use of a compressive nitride film is of particular benefit to n-FET devices having compressive nitride films of approximately 3.5 GPa. This has been demonstrated experimentally. In contrast, the highest stress that has been obtained for tensile films is of the order of 1.5 GPa.

Although the above invention has been described for n-FET devices, the conclusions are equally applicable to p-FETs, but the stress of the various stress films is reversed. Thus, the stress film over the source and drain would optimally be compressive in nature, while the stress film over the gate is tensile in nature.

Figure 5:
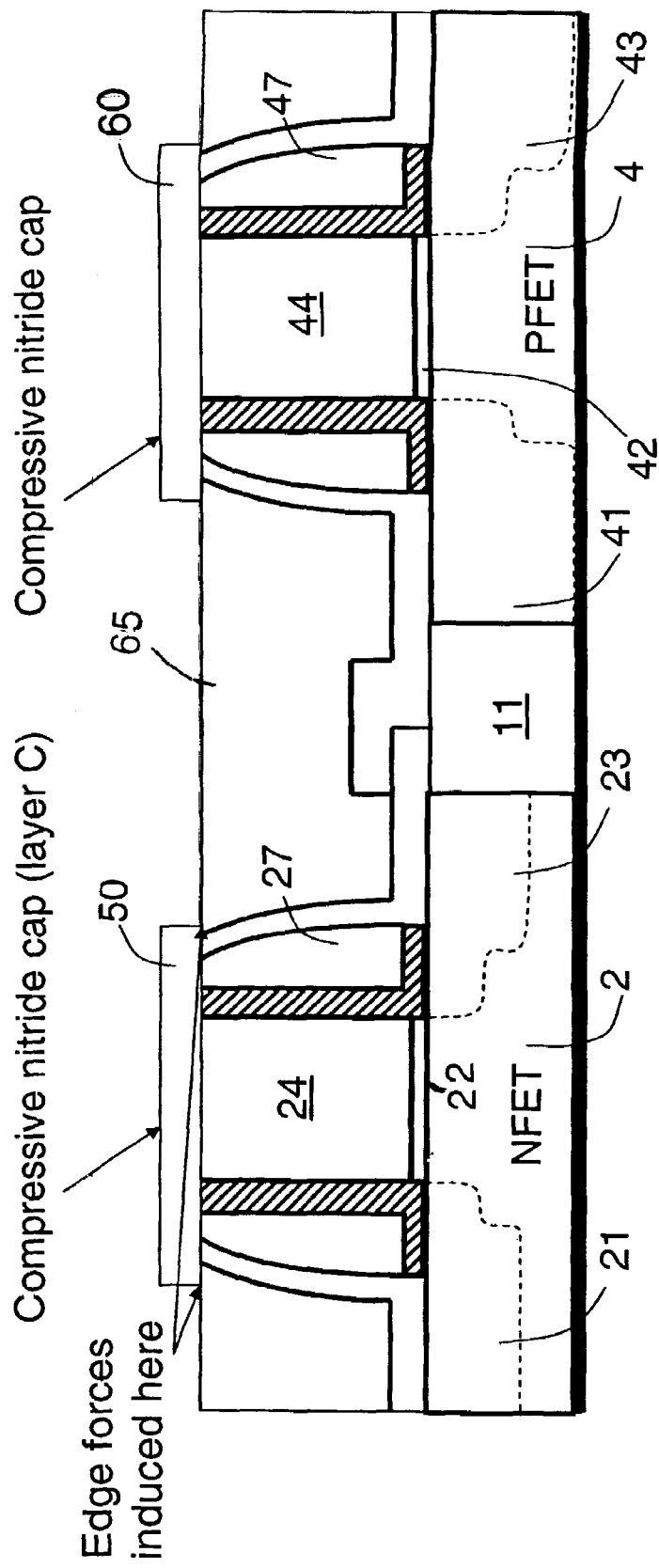
FIG. 5 illustrates the improved devices shown in FIG. 4, wherein the p-FET device is capped by a compressive nitride cap, in accordance with another embodiment of the present invention.

For optimal performance, one would simultaneously form tensile stressed liner caps on p-FETs and compressive stressed liner caps on n-FETs. However, performance advantage can be obtained with at lower cost or complexity by selectively capping either the n-FETs or the p-FETs, and performing an implant relaxation into the stressed cap covering the sub-optimally configured device (i.e., p-FET with compressive cap, or n-FET with tensile cap). Alternatively, one can employ silicon substrates in which one FET type is relatively insensitive to stress, and employ a single stressed liner cap to improve the performance of the other. For example, (001) silicon wafers, with gates oriented along <100> axes result in p-FETs which are rather insensitive to stress. In this case, a compressive cap on the n-FET and p-FET would be preferred and most economical implementation of this structure, as illustrated in FIG. 5.

Figure 3:
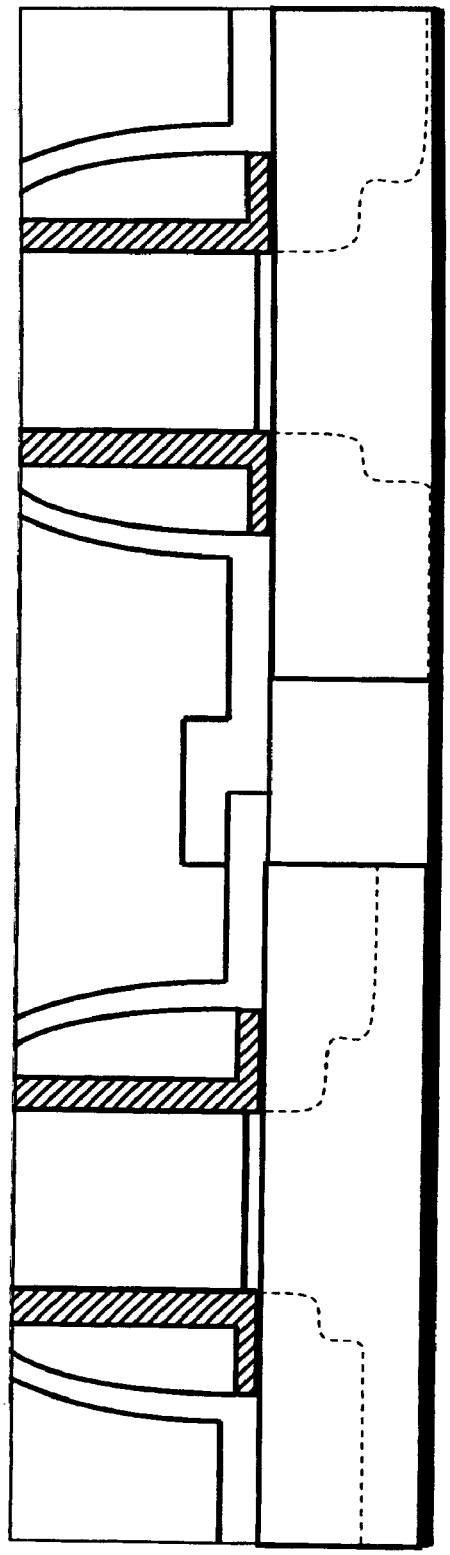
FIG. 3 illustrates a schematic diagram in which the nitride layer on top of the polysilicon has been removed, preferably, by chemical mechanical polishing, in order to planarize the surface above the target FET.

One advantage of patterning a compressive liner C, illustrated in FIG. 4, is the increase in mechanical stress that arises from the vertical edge force of the patterned film. The stress from the edge force adds to the mechanical stress in the channel already present from stress liner B. In addition, current state of the art compressive liners achieve much higher levels of stress compared to tensile liners (3.5 GPa for compressive versus 1.5 GPa for tensile). Using the compressive liner on the n-FET transistor is not possible in the conventional dual stress liner approach illustrated in FIGS. 1*a*-1*b* (prior art) as it would result in an undesirable compressive stress in the channel of the n-FET (since the compressive stress degrades n-FET mobility but enhances the hole mobility). However, creating a planarized flat surface using CMP (FIG. 3) with a patterned compressive liner on the flat surface (FIG. 4) gives rise to an edge force that imparts tensile stress in the channel of the MOSFET, and which has shown to be very beneficial for n-FET device improvement. Therefore this structure enables the use of higher magnitude compressive stress films on n-FET transistors to help maximize performance.

An additional advantage of the structure illustrated in FIG. 4 is that it reduces the sensitivity to spacing between gate electrodes. One of the problems with using the known prior art of dual stress liners as illustrated in FIGS. 1*a*-1*b* is the reduction of stress as the spacing between the gate electrodes diminishes.

Practitioners of the art will recognize that under certain constraints, the drive current can decrease as the spacing between the gate electrodes shrinks. This degradation arises because there is less volume of the stress liner material for applying stress in the channel of the MOSFET. Since the length (or volume) of the liner C depends only weakly on the distance between the 2 gates—i.e., the length is pitch insensitive—then the stress it applies is independent of the technology pitch.

Finally, the present structure shows that the stress increases as the thickness of the gate electrode is reduced. Reducing the thickness in advanced CMOS technology is desirable and can only enhance the stress gained from the patterned stress liner C.

Figure 6:
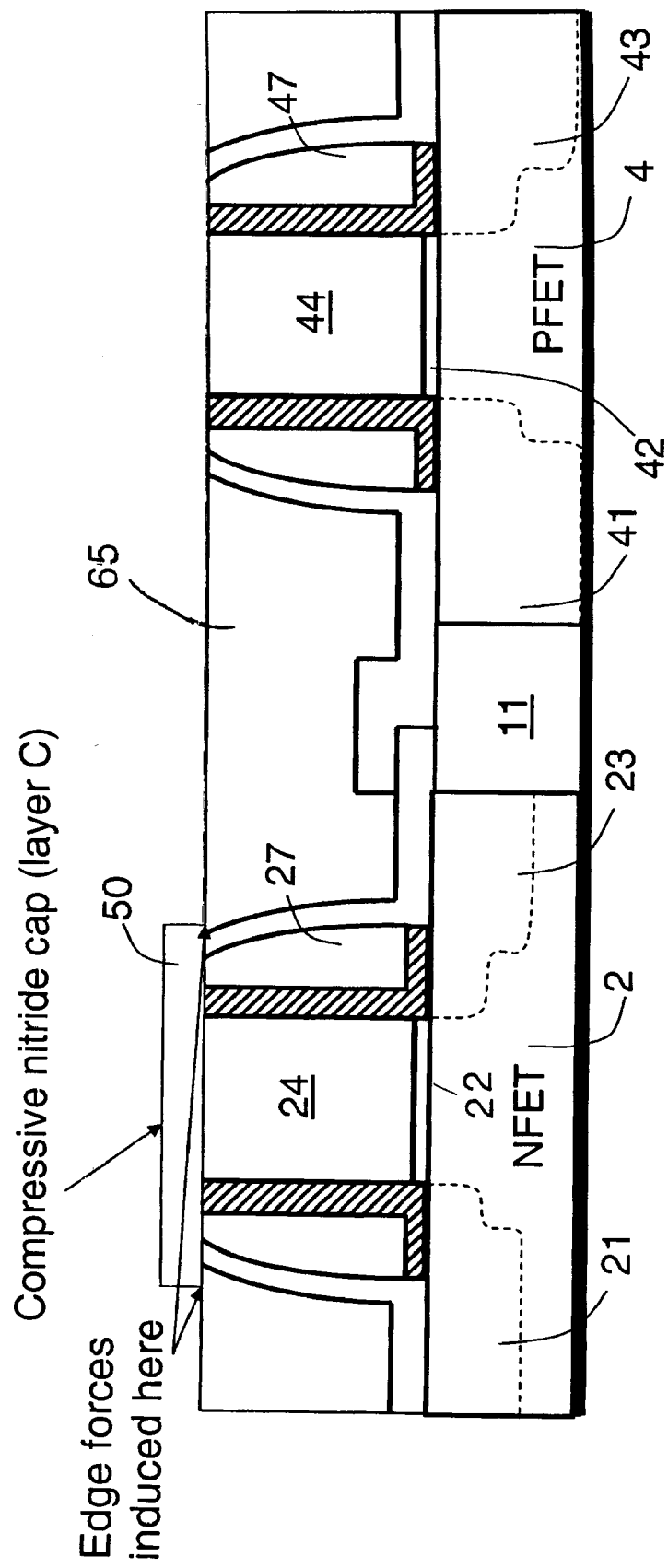
FIG. 6 illustrates the improved devices shown in FIG. 4, wherein the stress cap technique is provided to the n-FET, leaving the p-FET device fully uncapped, according to still another embodiment of the present invention.

Referring to FIG. 6, another embodiment of the invention shows the p-FET device without any cap atop the gate of the device. This is valid as long as the other (i.e., complementary) device is provided with an appropriate stressed cap on its corresponding gate. The benefit obtained is comparable to the compressive+implant solution, but it clearly saves the cost of the relaxation implant and added lithography.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for forming a semiconductor device on a substrate comprising:
    forming at least one n-channel field effect transistor (n-FET) and at least one p-channel field effect transistor (p-FET) that are separated from each other by a common dielectric layer; and
    forming a compressively stressed discrete dielectric liner segment overlaying and contacting a gate of said at least one n-FET and a discrete dielectric liner segment under tensile stress overlaying and contacting a gate of said at least one p-FET; wherein said tensile discrete dielectric liner segment overlaying and contacting said at least one p-FET gate is a compressive nitride cap.

2. The method of claim 1, wherein said tensile discrete dielectric liner segment nitride cap overlays and contacts only one of said p-FET gates and said n-FET gates.

3. The method of claim 1, wherein said tensile discrete dielectric liner segment overlaying and contacting said at least one p-FET gate is a compressive nitride cap in combination with a relaxation cap.

4. The method of claim 1, wherein each of said compressive and tensile discrete dielectric liner segments have a thickness ranging from 40 nm to 100 nm.

5. The method of claim 1, wherein said compressive discrete dielectric liner segment is made of a material selected from a group consisting of SiN, $SiO_2$, SiCOH, $HfO_2$, and $ZrO_2$.

* * * * *